(12) United States Patent
Shreve et al.

(10) Patent No.: US 10,854,006 B2
(45) Date of Patent: Dec. 1, 2020

(54) AR-ENABLED LABELING USING ALIGNED CAD MODELS

(71) Applicant: Palo Alto Research Center Incorporated, Palo Alto, CA (US)

(72) Inventors: Matthew A. Shreve, Mountain View, CA (US); Robert R. Price, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 130 days.

(21) Appl. No.: 16/192,634

(22) Filed: Nov. 15, 2018

(65) Prior Publication Data

US 2020/0160601 A1    May 21, 2020

(51) Int. Cl.

| | |
|---|---|
| *G06T 19/00* | (2011.01) |
| *G06K 9/00* | (2006.01) |
| *G06T 7/70* | (2017.01) |
| *G06F 30/00* | (2020.01) |
| *G06K 9/62* | (2006.01) |
| *G06N 5/04* | (2006.01) |

(52) U.S. Cl.
CPC ............ *G06T 19/006* (2013.01); *G06F 30/00* (2020.01); *G06K 9/00201* (2013.01); *G06K 9/00671* (2013.01); *G06K 9/6256* (2013.01); *G06N 5/046* (2013.01); *G06T 7/70* (2017.01)

(58) Field of Classification Search
CPC .. G06K 9/6256; G06K 9/00671; G06K 9/006; G06K 9/00624; G06K 9/6215; G06F 30/00
USPC ........................................................ 382/182
See application file for complete search history.

(56) References Cited

U.S. PATENT DOCUMENTS 10,402,649 B2 * 9/2019 Rabinovich et al. .......................
G06K 9/00671
345/8

OTHER PUBLICATIONS

Pat Marion et al., LabelFusion: A Pipeline for Generating Ground Truth Labels for Real RGBD Data of Cluttered Scenes, Jul. 15, 2017, retrieved form the Internet: URL: https://arxiv.org/pdf/1707.04796.pdf. *abstract* *Section III* (Year: 2017).*
Sanni, Siltanen, Theory and applications of marker-based augmented reality. Julkaisija-Utagivare, 2012, pp. 3, 126, 129 (Year: 2012).*

(Continued)

*Primary Examiner* — Sumati Lefkowitz
*Assistant Examiner* — Guy Kouaho
(74) *Attorney, Agent, or Firm* — Shun Yao; Park, Vaughan, Fleming & Dowler LLP

(57) ABSTRACT

One embodiment provides a system that facilitates efficient collection of training data for training an image-detection artificial intelligence (AI) engine. During operation, the system obtains a three-dimensional (3D) model of a physical object placed in a scene, generates a virtual object corresponding to the physical object based on the 3D model, and substantially superimposes, in a view of an augmented reality (AR) camera, the virtual object over the physical object. The system can further configure the AR camera to capture a physical image comprising the physical object in the scene and a corresponding AR image comprising the virtual object superimposed over the physical object, and create an annotation for the physical image based on the AR image.

20 Claims, 6 Drawing Sheets
(2 of 6 Drawing Sheet(s) Filed in Color)

(56) References Cited

OTHER PUBLICATIONS

Aldoma Aitor et al.: "Automation of "Ground Truth" Annotation for Multi-View RGB-D Object Instance Recognition", 2014 IEEE/RSJ International Conference on Intelligent Robots and Systems, IEEE, Sep. 14, 2014, pp. 5016-5023. *Abstract; figure 6* *Sections III F, G, IV and subsections*.

* cited by examiner

AR-ENABLED LABELING USING ALIGNED CAD MODELS

BACKGROUND

Field

This disclosure is generally related to computer vision systems. More specifically, this disclosure is related to a system and method using augmented reality (AR) technology and pre-existing computer-aided design (CAD) models for efficient collection of training data for machine learning.

Related Art

Currently, machine-learning technologies have made significant progress in detecting objects (e.g., faces, cars, buildings, etc.) in images. In certain applications, identified objects can be highlighted using a rectangular bounding box. For example, digital cameras can be configured to place rectangular boxes surrounding faces in images. However, such bounding boxes do not conform to the shapes of the objects and can have limited utility in fine-grain scene analysis. The ability of segmenting an object out from its background by having a pixel-level outline of the object can lead to faster training (e.g., more efficient collection of training samples) and more accurate location and orientation detection of objects. Moreover, such an ability can enable new applications that rely on the precise identification of objects' boundaries, such as augmented reality and image-editing applications.

A key barrier in training pixel-level segmentation systems is obtaining training data that provides pixel-level outlines of objects in sample images. Traditionally, obtaining the training data can be accomplished through a tedious process of manually annotating or labeling (e.g., manually indicating the location of parts or objects) objects of interest in collected images or video frames. Such an inefficient process can either be done by domain experts or by crowd sourcing. Domain experts can provide high-precision labels, which can involve significant expenditure in cost and time. On the other hand, although crowdsourced workers (e.g., Amazon Mechanical Turks) can provide labels at a low cost and fast turnaround, the precision and accuracy of the labels may potentially be compromised.

Various approaches have been proposed recently to collect semantic segmentation labels that leverage three-dimensional (3D) information to speed up the process. For example, SemanticPaint is an interactive virtual reality (VR) approach that allows users to paint the surface of 3D reconstructed objects using a hand gesture that triggers a pixel-level label propagation algorithm. The system is designed to be fully online as the user provides live feedback of the labeling. Another interactive 3D labeling approach can involve performing an initial 3D segmentation of the scene using a combination of Markov Random Fields (MRF) and object localization, followed by user refinement. A different approach can use a depth sensor and state-of-art algorithms to reconstruct a 3D indoor scene, and then use crowdsourced workers to annotate objects in the reconstructed 3D scenes. All these approaches rely on complex algorithms and extensive manual labor.

SUMMARY

One embodiment provides a system that facilitates efficient collection of training data for training an image-detection artificial intelligence (AI) engine. During operation, the system obtains a three-dimensional (3D) model of a physical object placed in a scene, generates a virtual object corresponding to the physical object based on the 3D model, and substantially superimposes, in a view of an augmented reality (AR) camera, the virtual object over the physical object. The system can further configure the AR camera to capture a physical image comprising the physical object in the scene and a corresponding AR image comprising the virtual object superimposed over the physical object, and create an annotation for the physical image based on the AR image.

In a variation on this embodiment, creating the annotation for the physical image can include creating pixel-level labels for the physical image.

In a further variation, the annotation for the physical image can include a pixel mask, which links a label for a pixel in the AR image to a pixel in the physical image, and the label for the pixel in the AR image is created based on the 3D model.

In a variation on this embodiment, the 3D model can include a computer-aided design (CAD) model associated with the physical object or a 3D model of the physical object generated using a 3D scanning technology.

In a variation on this embodiment, superimposing the virtual object over the physical object can include manually aligning, in the view of the AR camera, the virtual object to the physical object or using a feature-analysis technique to automatically align, in the view of the AR camera, the virtual object to the physical object.

In a variation on this embodiment, the system can further modify an imaging condition to create an updated AR camera view; realign, in the updated AR camera view, the virtual object to the physical object; capture an additional physical image and an additional corresponding AR image; and annotate the additional physical image based on the AR image.

In a further variation, realigning the virtual object to the physical object can include tracking a pose of the AR camera, calculating a pose of the physical object in the updated camera view based on the tracked pose of the AR camera, and adjusting a pose of the virtual object based on the calculated pose of the physical object in the updated camera view.

In a further variation, modifying the imaging condition can include one or more of: modifying a distance between the camera and the physical object, modifying an angle of the camera, modifying a lighting condition, modifying a background in the scene, modifying a cosmetic appearance of the physical object, modifying a pose of the physical object, modifying a relative position between two components within the physical object, and adding or removing an occluding object.

In a variation on this embodiment, the system can further store, in a collection of training data, the physical image and the corresponding annotation; and train, based on the collection of training data, a convolutional neural network to identify the physical object.

In a variation on this embodiment, the AR camera can be part of a pair of smartglasses.

BRIEF DESCRIPTION OF THE FIGURES

The patent or application file contains at least one drawing executed in color. Copies of this patent or patent application publication with color drawing(s) will be provided by the Office upon request and payment of the necessary fee.

In the figures, like reference numerals refer to the same figure elements.

DETAILED DESCRIPTION

Figure 1:
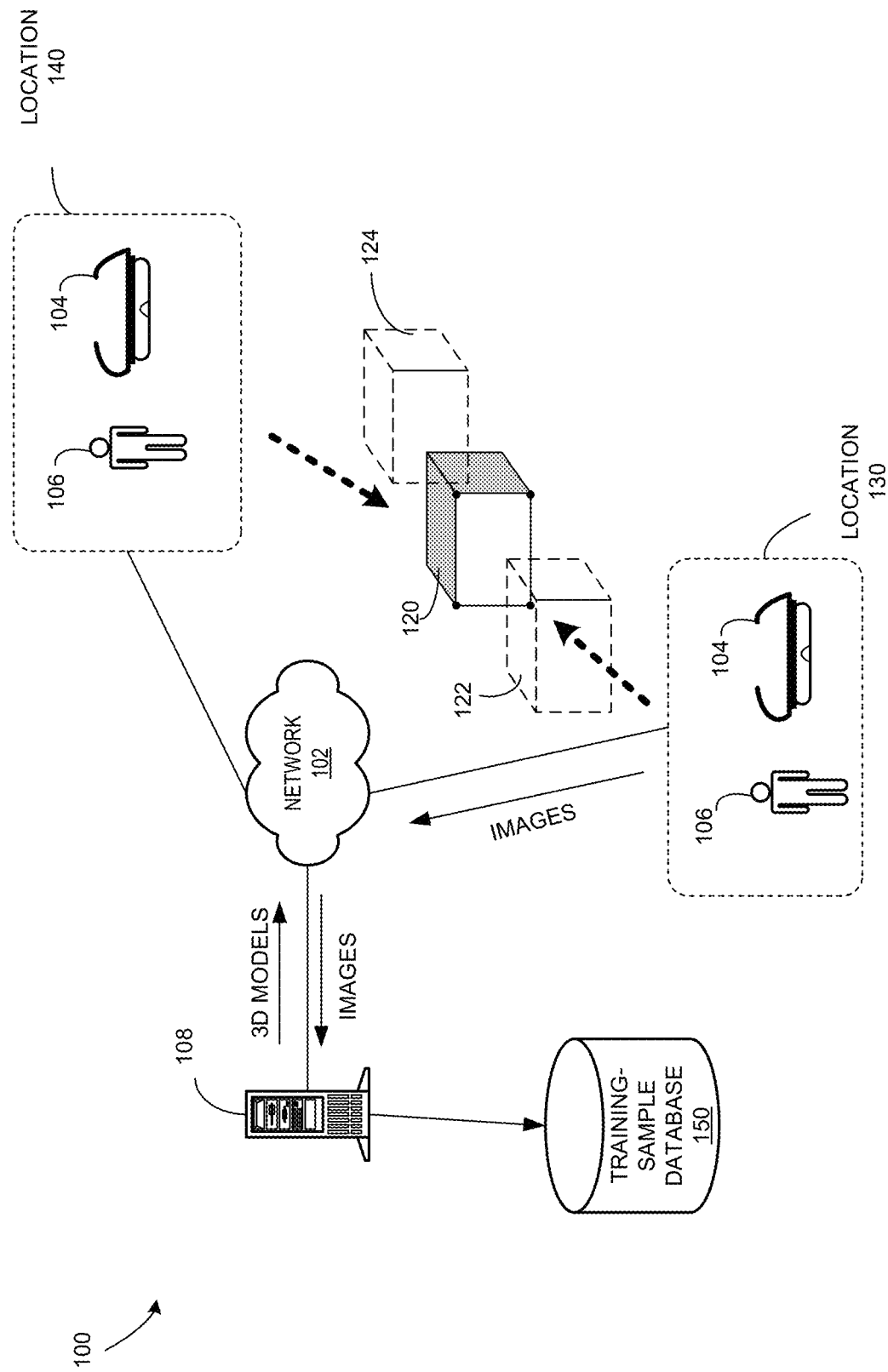
FIG. 1 illustrates an exemplary environment for facilitating efficient collection of training data, according to one embodiment.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Overview

The embodiments described herein solve the problem of reducing the burden of manual labeling of image-detection training data by providing a system that uses a fiducial-based tracking mechanism to align holographic CAD models to a real-world object (e.g., a printer). More specifically, during operation, a pose-tracking system (e.g., an augmented reality (AR) headset) can align a CAD model with the corresponding object in images captured by a camera associated with the pose-tracking system. As the camera moves in the real world to capture images from different locations and orientations, the tracking system can continuously track the location and orientation of the camera. Based on the tracking result, the system can then project a 2D outline of the CAD model over the object in each image taken by the camera. The system can then use the projected 2D outlines as pixel masks to train the pixel-level detection and segmentation machine-learning modules.

A user can use a recording device coupled to the tracking system to capture a first image of a physical object in an environment (e.g., a "scene") which is associated with a three-dimensional (3D) world coordinate frame. The tracking system can then align and overlay a corresponding 3D model (e.g., a CAD model or other types of 3D model) of the physical object over the physical object in the image and capture a second image. A pixel mask can be created based on the first and second images. The pixel mask can be annotated (e.g., manually) to link pixels in the mask to the different parts of the object. More specifically, each value in the mask is assigned the label associated at the corresponding pixel location in the CAD model. The user can then take an additional image of the object in the physical world (referred to as a physical image) from a different angle or distance, and optionally under a different lighting condition. The tracking system has the ability to continuously track the location and angle of the camera and, thus, is capable of inferring the pose of the object in the additional images. Based on the inferred pose, the system can obtain a 2D outline of the 3D model corresponding to the object in the image, project the 2D outline onto the object, and capture an image of the object with the model overlay (such an image can be referred to as an AR image). The system can also create a pixel mask based on the physical image and AR image. Because the pixels in the 3D model have been labeled previously, the created pixel mask can be automatically labeled based on the 3D model. Many (e.g., tens or hundreds of) images of the object can be taken under different imaging conditions and a labeled mask can be automatically created for each image. These pixel-level labeled images can then be used in training of object-detection neural networks.

By implementing AR technologies (e.g., by projecting the 3D model of an object onto the object in images captured under various conditions), the system facilitates automatic pixel-level labeling of images. This process can generate, with little effort from the user, a large number of labeled images that can be used to train an artificial intelligence (AI) system for object-detection tasks.

Thus, the embodiments described herein provide a system which increases the efficiency of collecting training data for machine learning. The increased efficiency can include a significant reduction in the amount of manual labeling required to annotate images at pixel level. Because effective machine learning is based on the diversity of training data, and because the system efficiently collects diverse training data, the embodiments described herein improve the technological field of machine learning.

AR-Enabled Pixel-Level Labeling

Many real-world objects, especially industry objects, may have corresponding pre-existing CAD models. Although these CAD models may not generate fully realistic renderings of the real-world objects, they can precisely define their 3D shapes. For example, when designing and manufacturing industrial equipment (e.g., printers, cars, etc.), the manufacturer typically develops 3D CAD models for the equipment, and those CAD models can include the exact dimensions of the different components within the equipment. Moreover, these CAD models can render images of the equipment having different poses or states. For example, the CAD model of a printer can render the image of the printer when the printer is viewed from different angles or when the printer has its paper tray open or closed. Such information can be very useful in pixel-level labeling, because the label of each pixel of the rendered image of the CAD model is prior knowledge.

In one exemplary embodiment, a user can use an AR headset (e.g., the Microsoft HoloLens™ system) to capture and display images of a real-world or physical object in a real-world environment or scene. Note that the HoloLens can use an RGB-D (red green blue plus depth) camera plus a simultaneous localization and mapping (SLAM) style algorithm to build a model of the room, and allows a user to place 3D virtual objects (e.g., 3D CAD models) in the real-world scene containing the physical object.

Moreover, the user can maneuver the 3D CAD model of the physical object such that the 3D CAD model can be superimposed onto the physical object in the displayed image, resulting in mixed-reality or augmented-reality images. Note that, in addition to HoloLens, other AR headsets, such as certain head-mounted display systems or smartglasses, can also be used to create the model-overlaid AR images. If the images captured and displayed by the HoloLens or other AR systems are two dimensional (2D), the system can effectively project the 2D outline or projection of the 3D CAD model onto the 2D physical object in the image.

As discussed previously, the pixel-level label of each pixel of the rendered image of the 3D CAD model is prior knowledge to the system, meaning that the system knows the component labeling of each pixel. On the other hand, when the 3D model is overlaid onto the image of the physical object, each pixel of the image of the physical object can be linked to a corresponding pixel of the rendered image of the CAD model. Consequently, the pixel-level labels of the rendered image of the CAD model can be transferred to the corresponding pixels of the image of the physical object.

Subsequent to the initial manual alignment of the 3D model and the physical object, the user can capture a number of images of the physical object from different views with the HoloLens, under different lighting conditions, at different distances and orientations, and in the presence of occluding objects. The HoloLens can calculate and track its pose as it moves around the physical object. Based on the pose of the HoloLens, the system can, in turn, infer the pose of the physical object in the corresponding image. The system can then render an image from the CAD model based on the inferred pose of the physical object. For example, the system can render an image (e.g., create a virtual object) from the CAD model in such a way that the displayed virtual object has the same pose as that of the physical object viewed by the HoloLens. Moreover, because the HoloLens maintains a 3D model of the environment (e.g., the room) including the coordinates of the physical object, the system can precisely overlay the virtual object (i.e., the computer-rendered image) onto the physical object to create a model-overlaid AR image. To create a 2D image, the system can render a 2D image from the CAD model and overlay that 2D image onto the 2D image of the physical object. Aligning and overlaying the virtual object onto the physical object can link pixels of the rendered image to corresponding pixels of the physical image. Similarly, pixels of the rendered image have known labels, which can then be transferred to corresponding pixels of the physical image, thereby achieving the goal of labeling the newly acquired image at the pixel-level.

In another exemplary embodiment, no corresponding CAD model for a physical object is available. In such a case, the system can generate a 3D model of the object using various modeling technologies, such as 3D scanning and volumetric photogrammetry.

Improvements to Existing Technologies

Some common forms of augmented reality (AR) in the service industry include a tethered telepresence, a visual retrieval of information, and a repair script with overlays. However, each of these results is hindered by inefficiencies. In a tethered telepresence, a remote technician may need to perform a visual inspection, which can require both connectivity and extensive human expert time. In a visual retrieval of information (e.g., the Digital GloveBox application), a camera may retrieve a model number, manual pages, or telemetry statistics. However, the output is a passive page and may be limited to a single room. In a repair script with overlays, a checklist or procedural prompt may be overlaid on a user's view, and the user can click through the overlaid view. However, the view may be expensive to create and is still mostly passive, in that the view is not able to understand the user's actions. Thus, producing standalone AR content currently requires extensive work (e.g., by artists, human experts, and machine-learning experts) to create images and video (e.g., animation) to train a model, which can result in an inefficient system.

The embodiments described herein provide a system which increases the efficiency of collecting training data for image-detection artificial intelligence (AI) engines. In addition to decreasing the amount of manual time and labor required to collect training data, the system can also decrease the development time of new object detection systems. More specifically, onetime manual alignment of the CAD model with the object is much simpler than having a domain expert hand paint the outline of the object in hundreds of images. In certain cases, the alignment between the CAD model and the physical object can be performed automatically by the tracking system (e.g., the HoloLens system).

Furthermore, embodiments of the system can quickly create large labeled data sets of parts of systems managed by customers, and use the labeled data sets to train computer vision systems. A trained system can assist service technicians with management and repair of a part of a system, and can also allow a customer to assist an end-user with repair of a system part (e.g., the Digital GloveBox and SmartScan applications). A differentiator between these existing tools and the proposed technology is the large amount of time needed to collect the training data for the computer vision systems encased within the existing tools. This large amount of time can be reduced to a tiny fraction (e.g., less than $\frac{1}{10}$) by using the embodiments of the system to collect training data.

Other exemplary systems managed by customers can include: cars or vehicles (where the dashboard or other car part, e.g., an engine or a feature in the cabin of the car, may be a region of interest for which the customer may require assistance); and printers or other devices (where a feeder tray, output tray, control panel, or other part may be the region of interest). A customer (or an end-user) who may require assistance can take a photo of the system with his cell phone, and obtain useful information about a certain "labeled" section of the photo. For example, if a user of a vehicle experiences an issue with the vehicle, the vehicle user can capture an image of the vehicle dashboard with his mobile device, and, based on the previously generated diverse set of labeled images of the dashboard from various camera poses, the vehicle user can obtain a labeled image that may be used to assist the user in understanding how to address the issue.

Embodiments of the system can also create deep vision-powered tools that allow domain experts to easily create new, standalone, interactive augmented reality coaches without needing expertise in machine learning of 3D modeling tools. The system can include features related to authoring, such as gestures for pointing at objects and regions, speech-to-text to provide labels, and object part segmentations. The system can also include curation, such as storage, indexing and metadata, and basic editing of clips. The system can further include features related to assistance, such as part recognition, label placement, flow control, and part condition determination. The system can increase robustness and generalization of training through background desensitivity, automatic lighting augmentation, and shadow generation. Furthermore, the system can include voice and activity recognition to support interactive coaching, as well as application integration and telemetry connections.

Thus, by using augmented reality (AR) headsets and previously known 3D models of objects to collect annotated training data for image-detection AI engines, the embodiments described herein can exploit the pose-tracking capability of AR technologies to collect training data from multiple perspectives without requiring manual pixel-level labeling for every new perspective of an object. This can result in a significant reduction in the burden of pixel-level labeling for training an effective computer vision AI.

Exemplary Environment for Facilitating Efficient Collection of Training Data

FIG. 1 illustrates an exemplary environment for facilitating efficient collection of training data, according to one embodiment. Environment 100 can include: an AR device 104 and an associated user 106; a computing device 108; and a physical object 120. AR device 104 can include an AR-enabled head-mounted display (such as a Microsoft HoloLens). Physical object 120 can be part of a scene (not shown), which has an associated 3D world coordinate frame. Computing device 108 can include a server or other computing device which can receive, transmit, and store data, and can maintain a 3D model of physical object 120. AR device 104 is coupled to computing device 108 via a network 102.

During operation, user 106 can use AR device 104 from a location 130 in the 3D world coordinate frame to capture a physical image of physical object 120. User 106 can further use AR device 104 to overlay a virtual object 122 on top of physical object 120. Virtual object 122 can be an image (e.g., a hologram) rendered from the 3D model of physical object 120. In some embodiments, user 106 can maneuver virtual object 122 in the 3D world coordinate frame in such a way that a substantially precise alignment can be achieved between virtual object 122 and physical object 120. In alternative embodiments, AR device 104, together with computing device 108, can perform feature analysis on the physical image to detect the location and orientation (e.g., 3D coordinates) of physical object 120 in the real-world scene. Based on the detected location and orientation, AR device 104 can automatically superimpose virtual object 122 over physical object 120. This can eliminate the need for manual alignment. User 106 can then use AR device 104 to capture an image of the scene, with virtual object 122 overlaying physical object 120. Such an image can be referred to as a model-overlaid AR image. Note that AR device 104 can also be configured to capture the physical image immediately after capturing the model-overlaid AR image such that there is no change in position of AR device 104 between these two images. Consequently, each pixel in the physical image can be aligned to a corresponding pixel in the model-overlaid AR image. AR device 104 can then send both the physical image and the model-overlaid AR image to computing device 108.

Computing device 108 maintains the 3D model of physical device 120 and, hence, each pixel of virtual object 122 within model-laid AR image can be automatically assigned a label, identifying the pixel as being part of virtual object 122 and which part. For example, if virtual object 122 is rendered from the CAD model of a printer, a pixel of virtual object 122 can be identified as being part of the front panel or paper tray. Based on the received physical and model-overlaid AR images, computing device 108 can generate a pixel mask for the physical image. More specifically, the pixel mask can assign a label for each pixel, and the label can indicate whether the pixel in the image belongs to the physical object and, if so, which part of the physical object. Using an image of a printer in a room as an example, a pixel mask for that image can indicate, for each pixel in the image, whether the pixel is part of the background (e.g., the room) or the printer. For each pixel belonging to the printer, the pixel mask can indicate which part (e.g., printer front panel, paper tray, toner, etc.) that pixel belongs to. The pixel mask essentially provides annotations to the physical image. Computing device 108 can store both the physical image and the corresponding pixel mask. In some embodiments, the physical image and the corresponding pixel mask can be stored in a training-sample database 150.

User 106 can move around in the scene and use AR device 104 from a location 140 (which is different from location 130) to capture additional physical and model-overlaid AR images of physical object 120. Note that, because AR device 104 has the ability to track its own pose, AR device 104 or computing device 108 can apply a counter-tracking algorithm to infer the pose of physical object 120 viewed by AR device 104 at location 140. More specifically, when applying the counter-tracking algorithm, AR device 104 can take into account the pose of the previously aligned CAD model and the change in pose of AR device 104 between positions 130 and 140. Such pose information can be used by computing device 108 to create a virtual object 124 that corresponds to the current pose of physical object 120. Knowing the 3D coordinates of the physical object in the physical world, AR device 104 can automatically project virtual object 124 onto physical object 120 such that virtual object 124 is substantially aligned to physical object 120, when viewed by AR device 104 from location 140. In some embodiments, as AR device 104 moves, it can continuously track its movement and send such information to computing device 108, which can then continuously update the configuration of the 3D model in such a way that virtual object 122 remains aligned to and superimposed over physical object 120 at all times. In alternative embodiments, the movement of AR device 104 may cause virtual object 122 to misalign to physical object 120, and the system can realign virtual object 122 in response to determining that the AR device 104 stops moving (e.g., remaining stationary for a predetermined time). It is also possible for virtual object 122 to disappear in the display of AR device 104 in response to movements of AR device 104. When AR device 104 stops moving, AR device 104 communicates its current pose to computing device 108, which creates virtual object 124 superimposed over physical object 120 based on the 3D model and the current pose of AR device 104.

Subsequently, similar to what happened at location 130, AR device 104 can capture both the physical image and model-overlaid image of physical object 120 in the scene, and send these images to computing device 108. Computing device 108 can then create, based on the physical and model-overlaid image, a pixel mask, which provides the pixel-level labeling to the physical image. As stated before, each pixel in the pixel mask is linked to a label, indicating whether a corresponding pixel in the physical image belongs to the physical object and if so, to which part of the physical object. Computing device 108 can further store the physical image and its pixel mask in training-sample database 150.

Furthermore, user 106 can continue to move around in the room and use AR device 104 to capture additional images. The tracking capability of AR device 104 allows the system to be aware of the pose of AR device 104 at all times and, hence, can accurately superimpose virtual objects, which are rendered from the CAD model of physical object 120, onto physical object 120 to create the model-overlaid AR images. These model-overlaid AR images can facilitate the creation of pixel masks, with one pixel corresponding to one physical image. The physical images and their accompanying pixel masks can then be sent to and stored in training-sample database 150 to be used for future training of an image-detection or object-detection AI that can detect various objects in images. Compared to traditional approaches, this AR-assisted approach for collecting training data can be much efficient and require a smaller amount of manual labor. In some embodiments, it can also be possible to attach, after the initial alignment between the 3D model and physical object 120, AR device 104 to an automatic motion system that can move around in the scene to further reduce the need for manual labor. If the initial alignment can be done automatically through feature analysis, the entire training-data-collection process can be performed automatically.

In addition to changing the pose of AR device 104, other types of variation in the image condition can be introduced in order to achieve a great diversity in the obtained training data. In some embodiments, the lighting conditions can also be changed. Moreover, the system can add one or more occluding objects, make changes in the background using real or virtual objects, or cosmetically alter the appearance of physical object 120 (e.g., changing its color appearance). If physical object 120 includes multiple components, the system can alter the relative positions of the components. For example, if physical object 120 is a printer, the system can modify the appearance of the printer by opening or closing the paper tray, or by opening the front cover to expose the toner.

Method for Facilitating Efficient Collection of Training Data

Figure 2:
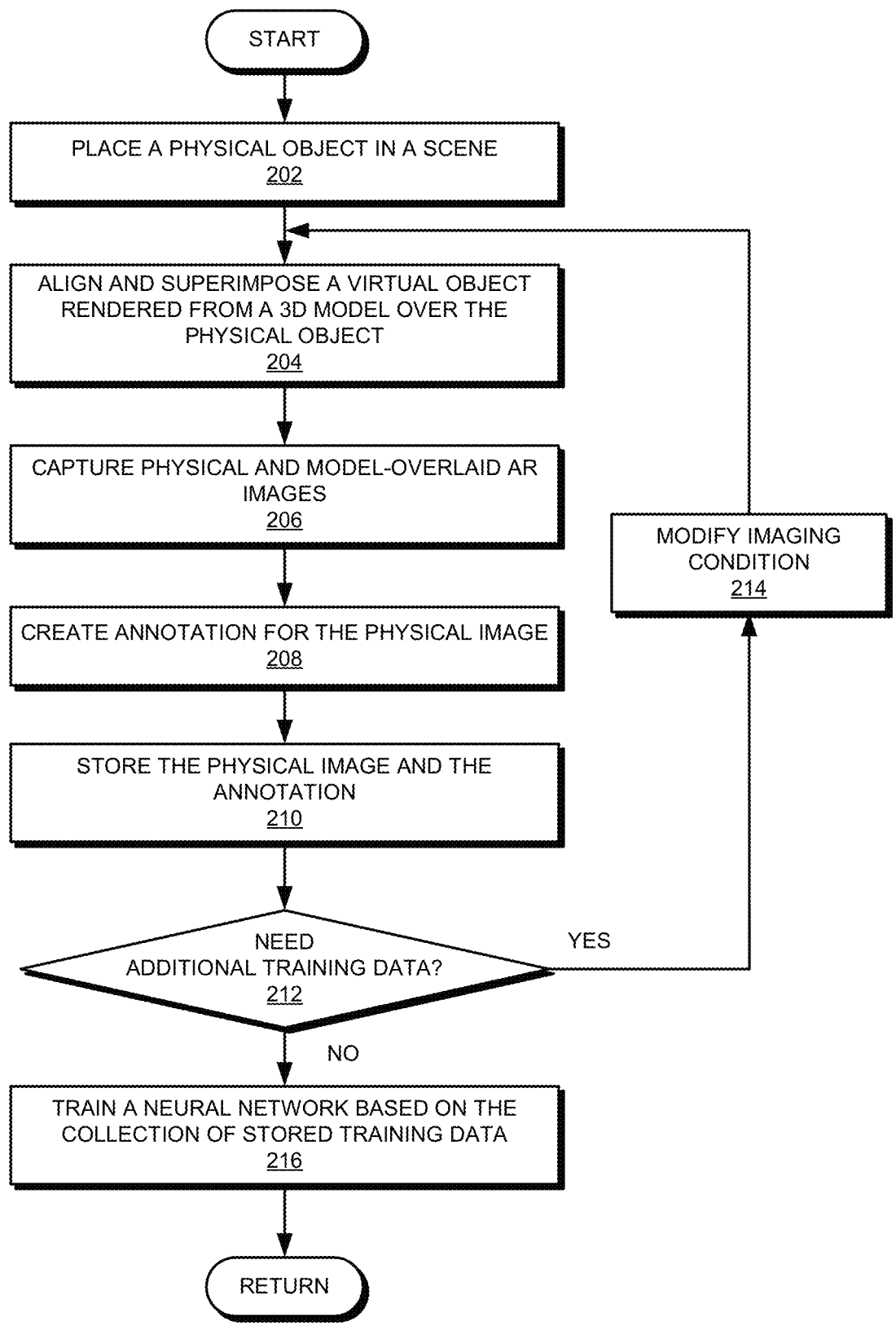
FIG. 2 presents a flowchart illustrating an exemplary process for collecting training data, according to one embodiment.

FIG. 2 presents a flowchart illustrating an exemplary process for collecting training data, according to one embodiment. During operation, a physical object of interest can be placed in a scene, e.g., a room (operation 202). The object of interest can often represent a type of physical object that may later be detected by the object-detection AI engine. For example the physical object of interest can be a printer, and after training, the object-detection AI engine may be able to detect many different brands and models of printer, not just one particular type of printer.

The system can use a tracking-enabled AR device (which often includes a camera) to align and superimpose a virtual object rendered from a 3D model over the physical object in the camera view (operation 204). Note that the tracking-enabled AR device can define a 3D world coordinate frame for the environment (e.g., the room). In some embodiments, the AR device can be a head-mounted display (such as a Microsoft HoloLens). The 3D model of the object can include a CAD model, which can provide more precise dimension information and the inter-component positioning information. When a CAD model is not available, a 3D model can be created by performing 3D scanning on the physical object. Once model alignment is achieved, the system can optionally anchor the real-world location of the virtual object to the environment using 3D mapping and tracking, which are functions provided by the AR device. For example, the system can record the 3D coordinates of the virtual object. In this case, the 3D coordinates of the virtual object match those of the physical object.

The system can capture at least two images, one physical image (i.e., the real-world scene without the virtual object) and one model-overlaid AR image (i.e., the AR image with the virtual object superimposed over the physical object (operation 206). The system can then create annotation for the physical image based on the model-overlaid AR image (operation 208). In some embodiments, the annotation can be in the form of a pixel mask. More specifically, the system can link each pixel in the physical image to a corresponding pixel in the AR image and transfer the pixel-level labeling (which is known to the system based on the 3D model) from the AR image to the physical image. The pixel-level labeling of each pixel indicates whether the pixel belongs to the physical object and, if so, to which part.

The system stores, in a collection of training data, the physical image and its corresponding annotation, e.g., the pixel mask (operation 210). In some embodiments, the system may alternatively create an annotated image (e.g., by painting pixels having different labels different colors or by highlighting the outlines of the different parts of the physical object) and store the annotated image. This allows the annotated images generated by the current system to be added to the existing training data library.

The system can then determine whether additional training data is needed (operation 212). If so, the system can modify the imaging condition (operation 214). Modifying the imaging condition can involve changing the location and angle of the camera, which can be part of the AR device; changing the lighting condition; modifying the background; adding or removing occluding objects; changing the pose of the physical object; changing the cosmetic appearance of the physical object; changing the physical configuration (e.g., inter-component positions) of the physical object, etc. This can create an updated scene in the camera view. The system can then realign the virtual object to the physical object in the updated scene, as viewed by the camera (operation 204). In some embodiments, as the camera moves, the system may continuously track the camera's movement and update the configuration of the 3D model in such a way that the virtual object remains aligned to the physical object. In alternative embodiments, the movement of the camera may cause the virtual object to misalign to the physical object, and the system can realign the virtual object in response to determining that the camera stops moving (e.g., the camera remains stationary for a predetermined time). Operations 204-214 can be repeated many times in order to create many training samples. Because the image annotation can be done automatically, this process can be very efficient.

If no more training data is needed for the current object, the system can train an object-detection neural network using the collection of stored training data (operation 216). In some embodiments, the system can send the collection of training data to a different entity, which can use it to train an image- or object-detection AI engine. More specifically, the AI engine (e.g., a convolutional neural network) can be trained to identify similar physical objects from images. Moreover, because the CAD-model-based pixel-level labeling can distinguish various components within the same physical object, the AI engine can also be trained to recognize the different components of the physical object. Such features can be very important in the service industry, more particularly, remote service. The collection of training data can also be sent to an online training-sample database to allow remote users to download the training data that can be used for training various types of AIs.

Figure 3:
FIG. 3 illustrates exemplary physical and model-overlaid AR images, according to one embodiment.

FIG. 3 illustrates exemplary physical and model-overlaid AR images, according to one embodiment. More specifically, the top left drawing shows a physical printer 302, and the top right drawing shows the physical printer being superimposed by a virtual printer 304. As discussed previously, virtual printer 304 can be rendered from the corresponding CAD model of physical printer 302. As discussed previously, each pixel in physical printer 302 can be linked to a corresponding pixel in virtual printer 304, and labels of those pixels in virtual printer 304 are known based on the CAD model. Those labels can then be mapped to the pixels in physical printer 302, thus achieving pixel-level labeling of the image.

The bottom left drawing of FIG. 3 shows a physical printer 306 with its front door open, exposing the internal printer components, such as the toner. As one can see from FIG. 3, the toner appears black and distinguishing the toner from the black interior of the printer can be difficult, making manual labeling a challenge. The bottom right drawing of FIG. 3 shows a virtual printer 308, also with its front door open, superimposed upon physical printer 306. As one can see in FIG. 3, the internal components of virtual printer 308 can be shown to have more color contrast. In some embodiments, virtual object 308 can be configured manually to match the configuration of physical object 306. For example, before superimposing virtual object 308, the user notices that printer 306 has its front door open and then configures the 3D model in order to render an image of the printer with its front door open. In alternative embodiments, the system may automatically determine, based on feature analysis results of the image of printer 306, that the front door of printer 306 is open. The system can then configure the 3D CAD model accordingly in order to generate virtual printer 308.

Figure 4:
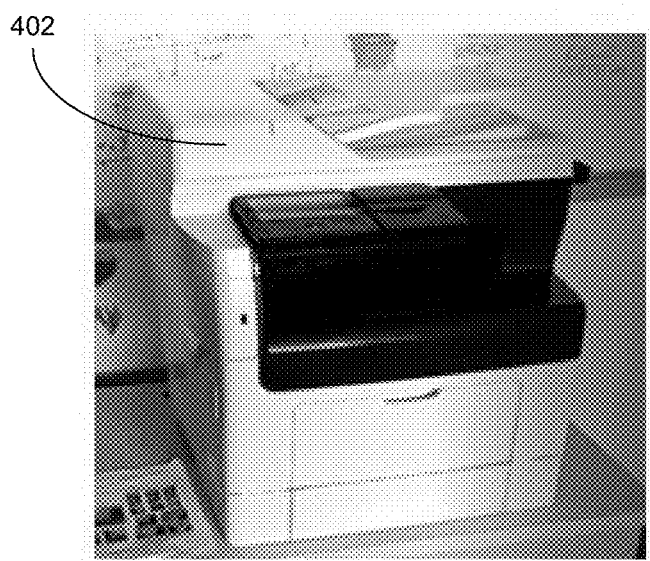
FIG. 4 illustrates exemplary physical and model-overlaid AR images, according to one embodiment.
Figure 4:
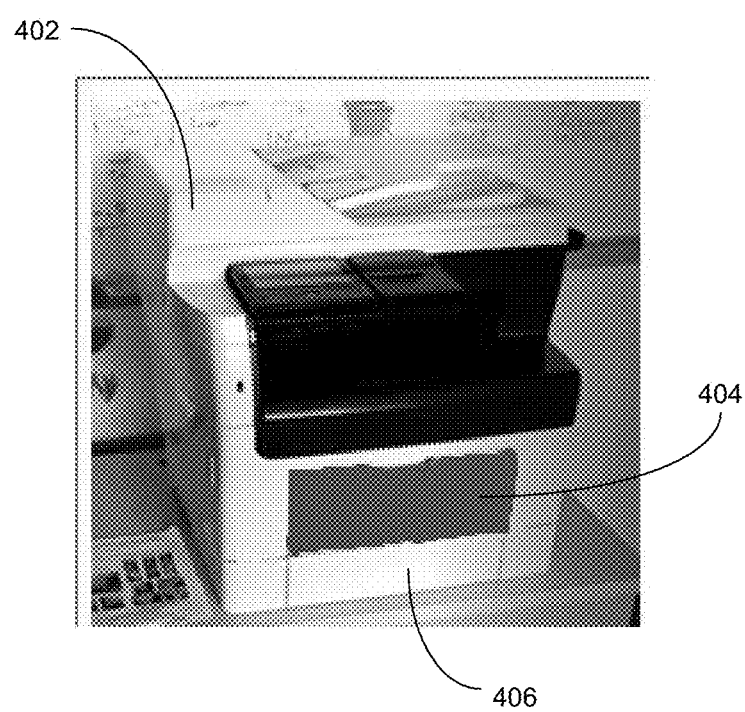

Compared to conventional manual approaches, this AR-assisted approach is not only more efficient but also accurate, especially in labeling the different parts of an object. Because the 3D model has the exact dimensions and relative position information associated with the physical object, an accurate alignment between the 3D model and the physical object can lead to an accurate labeling of pixels. Depending on the need, in some embodiments, instead of superimposing an entire virtual object over the corresponding physical object, it is also possible to superimpose a particular component of the virtual object over the corresponding part on the physical object. As a result, it is possible to create labels for just one particular component or part of a physical object. FIG. 4 illustrates exemplary physical and model-overlaid AR images, according to one embodiment. More specifically, the top drawing of FIG. 4 shows a physical object 402 and the bottom drawing of FIG. 4 shows the same physical object 402 with its bypass tray 404 labeled. The labeling of bypass tray 404 can be indicated using a different, often bright, color (e.g., blue). As one can see from FIG. 4, the different parts (e.g., bypass tray 404 and a neighboring component 406) of printer 402 can be quite close to each other, making manual labeling of these parts difficult. However, the 3D-model-based labeling does not face such a problem, because the labeling is automatically done based on the 3D coordinates of the physical object and a precise 3D model.

In the previously discussed examples, the AR device used in the system can include head-mounted displays (HMDs). In practice, in addition to HMDs, any AR-enabled system can be used for efficient collection of the training data, as long as they can meet the following requirements. The AR-enabled system can include a camera capable of capturing 2D or 3D images of the real-world scene. The AR-enabled system can access 3D models of physical objects and create virtual objects based on those 3D models. The AR-enabled system can have the ability to track the position of the virtual object in the real-world scene. This allows the system to align and superimpose the virtual object over the physical object. Moreover, the AR-enabled system can track the pose of the camera (e.g., by using motion or position sensors) such that after the camera moves, the system can move the virtual object accordingly in order to continuously align the virtual object to the physical object in the camera's view. In the case of the HMD, the camera, the display, and the tracking system can be integrated into a single device. In other scenarios, these different components may be distributed to one or more networked devices. For example, the camera and display can each be a standalone device or be combined into a single device.

Exemplary Computer and Communication System

Figure 5:
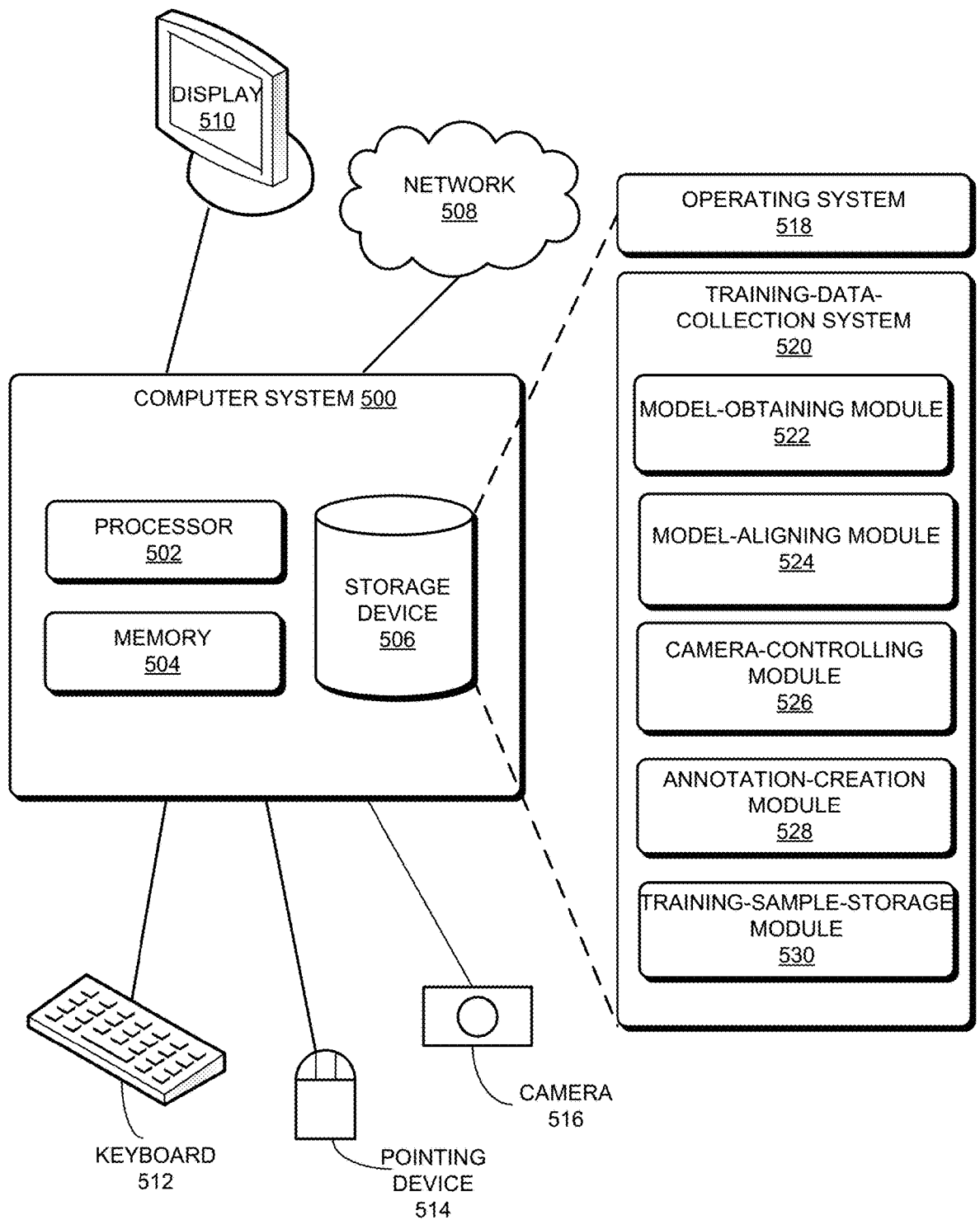
FIG. 5 illustrates an exemplary computer system that facilitates a training-data-collection system, according to one embodiment.

FIG. 5 illustrates an exemplary computer system that facilitates a training-data-collection system, according to one embodiment. Computer system 500 includes a processor 502, a memory 504, and a storage device 506. Computer system 500 can be coupled to a display device 510, a keyboard 512, a pointing device 514, a camera 516, and can also be coupled via one or more network interfaces to network 508. Storage device 506 can store an operating system 518, and a training-data-collection system 520.

Training-data-collection system 520 can include instructions, which when executed by computer system 500 can cause computer system 500 to perform methods and/or processes described in this disclosure. Training-data-collection system 520 can include instructions for accessing or obtaining a 3D model of a physical image (model-obtaining module 522), instructions for aligning a virtual object generated by the 3D model to the corresponding physical object in the view of camera 516 (model-aligning module 524), instructions for controlling camera 516 to capture images, including both the physical and model-aligned AR images (camera-controlling module 526), instructions for annotating the physical image (e.g., creating a pixel mask) (annotation-creation module 528), and instructions for storing the training samples, which can include the physical image and its corresponding annotation (training-sample-storage module 530).

Figure 6:
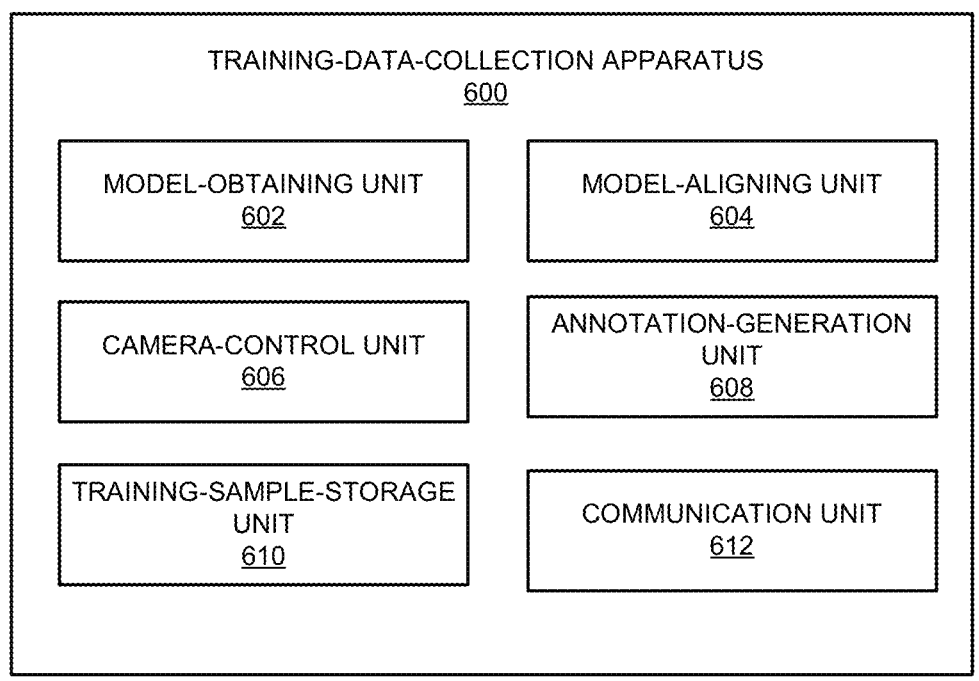
FIG. 6 illustrates an exemplary apparatus that facilitates a training-data-collection system, according to one embodiment.

FIG. 6 illustrates an exemplary apparatus that facilitates a training-data-collection system, according to one embodiment. Apparatus 600 can comprise a plurality of units or apparatuses that may communicate with one another via a wired, wireless, quantum light, or electrical communication channel. Apparatus 600 may be realized using one or more integrated circuits, and may include fewer or more units or apparatuses than those shown in FIG. 6. Further, apparatus 600 may be integrated in a computer system, or realized as a separate device that is capable of communicating with other computer systems and/or devices. Specifically, apparatus 600 can comprise units 602-610, which perform functions or operations similar to modules 522-530 of computer system 500 of FIG. 5, including: a model-obtaining unit 602, a model-aligning unit 604, a camera-control unit 606, an annotation-generation unit 608, and a training-sample storage unit 610. Apparatus 600 can further include a communication unit 612.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described above can be included in hardware modules or apparatus. The hardware modules or apparatus can include, but are not limited to, application-specific integrated circuit (ASIC) chips, field-programmable gate arrays (FPGAs), dedicated or shared processors that execute a particular software module or a piece of code at a particular time, and other programmable-logic devices now known or later developed. When the hardware modules or apparatus are activated, they perform the methods and processes included within them.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A computer-implemented method for facilitating efficient collection of training data for training an image-detection artificial intelligence (AI) engine, the method comprising:
    obtaining a three-dimensional (3D) model of a physical object placed in a scene;
    generating a virtual object corresponding to the physical object based on the 3D model; and
    configuring an augmented reality (AR) camera to:
        automatically superimpose the virtual object over the physical object in a view of the AR camera;
        capture a physical image comprising the physical object in the scene and a corresponding AR image comprising the virtual object superimposed over the physical object; and
        automatically create an annotation for the physical image based on the AR image.

2. The computer-implemented method of claim 1, wherein creating the annotation for the physical image comprises creating pixel-level labels for the physical image.

3. The computer-implemented method of claim 2, wherein the annotation for the physical image comprises a pixel mask, which links a label for a pixel in the AR image to a pixel in the physical image, and wherein the label for the pixel in the AR image is created based on the 3D model.

4. The computer-implemented method of claim 1, wherein the 3D model comprises:
    a computer-aided design (CAD) model associated with the physical object; or
    a 3D model of the physical object generated using a 3D scanning technology.

5. The computer-implemented method of claim 1, wherein the AR camera is configured to automatically superimpose the virtual object over the physical object by applying a feature-analysis technique to automatically align, in the view of the AR camera, the virtual object to the physical object.

6. The computer-implemented method of claim 1, further comprising:
    modifying an imaging condition to create an updated AR camera view;
    realigning, in the updated AR camera view, the virtual object to the physical object;
    capturing an additional physical image and an additional corresponding AR image; and
    annotating the additional physical image based on the AR image.

7. The computer-implemented method of claim 6, wherein realigning the virtual object to the physical object comprises:
    tracking a pose of the AR camera;
    calculating a pose of the physical object in the updated camera view based on the tracked pose of the AR camera; and
    adjusting a pose of the virtual object based on the calculated pose of the physical object in the updated camera view.

8. The computer-implemented method of claim 6, wherein modifying the imaging condition comprises one or more of:
    modifying a distance between the camera and the physical object;
    modifying an angle of the camera;
    modifying a lighting condition;
    modifying a background in the scene;
    modifying a cosmetic appearance of the physical object;
    modifying a pose of the physical object;
    modifying a relative position between two components within the physical object; and
    adding or removing an occluding object.

9. The computer-implemented method of claim 1, further comprising:
    storing, in a collection of training data, the physical image and the corresponding annotation; and
    training, based on the collection of training data, a convolutional neural network to identify the physical object.

10. The computer-implemented method of claim 1, wherein the AR camera is part of a pair of smartglasses.

11. A computer system for facilitating efficient collection of training data for training an image-detection artificial intelligence (AI) engine, the system comprising:
    a processor; and
    a storage device storing instructions that when executed by the processor cause the processor to perform a method, the method comprising:
        obtaining a three-dimensional (3D) model of a physical object placed in a scene;
        generating a virtual object corresponding to the physical object based on the 3D model;
        configuring an augmented reality (AR) camera; to:
            automatically superimpose the virtual object over the physical object in a view of the AR camera;
            capture a physical image comprising the physical object in the scene and a corresponding AR image comprising the virtual object superimposed over the physical object; and
        automatically create an annotation for the physical image based on the AR image.

12. The computer system of claim 11, wherein creating the annotation for the physical image comprises creating pixel-level labels for the physical image.

13. The computer system of claim 12, wherein the annotation for the physical image comprises a pixel mask, which links a label for a pixel in the AR image to a pixel in the physical image, and wherein the label for the pixel in the AR image is created based on the 3D model.

14. The computer system of claim 11, wherein the 3D model comprises:
    a computer-aided design (CAD) model associated with the physical object; or
    a 3D model of the physical object generated using a 3D scanning technology.

15. The computer system of claim 11,
wherein the AR camera is configured to automatically superimpose the virtual object over the physical object by applying a feature-analysis technique to automatically align, in the view of the AR camera, the virtual object to the physical object.

16. The computer system of claim 11, wherein the method further comprises:
modifying an imaging condition to create an updated AR camera view;
realigning, in the updated AR camera view, the virtual object to the physical object;
capturing an additional physical image and an additional corresponding AR image; and
annotating the additional physical image based on the AR image.

17. The computer system of claim 16, wherein realigning the virtual object to the physical object comprises:
tracking a pose of the AR camera;
calculating a pose of the physical object in the updated camera view based on the tracked pose of the AR camera; and
adjusting a pose of the virtual object based on the calculated pose of the physical object in the updated camera view.

18. The computer system of claim 16, wherein modifying the imaging condition comprises one or more of:
modifying a distance between the camera and the physical object;
modifying an angle of the camera;
modifying a lighting condition;
modifying a background in the scene;
modifying a cosmetic appearance of the physical object;
modifying a pose of the physical object;
modifying a relative position between two components within the physical object; and
adding or removing an occluding object.

19. The computer system of claim 11, wherein the method further comprises:
storing, in a collection of training data, the physical image and the corresponding annotation; and
training, based on the collection of training data, a convolutional neural network to identify the physical object.

20. The computer system of claim 11, wherein the AR camera is part of a pair of smartglasses.

* * * * *